US011611006B2

(12) United States Patent
Hosken et al.

(10) Patent No.: US 11,611,006 B2
(45) Date of Patent: Mar. 21, 2023

(54) AUTOMATED REEL PROCESSES FOR PRODUCING SOLAR MODULES AND SOLAR MODULE REELS

(71) Applicant: SunPower Corporation, San Jose, CA (US)

(72) Inventors: Cameron Hosken, Redwood City, CA (US); David Okawa, San Bruno, CA (US); Thierry Nguyen, San Francisco, CA (US); Tamir Lance, Los Gatos, CA (US); Jason Kalus, Redwood City, CA (US)

(73) Assignee: Maxeon Solar Pte. Ltd., Marina Bay Financial Centre (SG)

( * ) Notice: Subject to any disclaimer, the term of this patent is extended or adjusted under 35 U.S.C. 154(b) by 49 days.

(21) Appl. No.: 15/965,237

(22) Filed: Apr. 27, 2018

(65) Prior Publication Data
US 2018/0315874 A1    Nov. 1, 2018

Related U.S. Application Data

(60) Provisional application No. 62/491,371, filed on Apr. 28, 2017.

(51) Int. Cl.
*H01L 31/0465* (2014.01)
*H01L 31/044* (2014.01)
(Continued)

(52) U.S. Cl.
CPC ........ *H01L 31/0465* (2014.12); *H01L 31/044* (2014.12); *H01L 31/049* (2014.12); *H01L 31/0443* (2014.12); *H01L 31/0516* (2013.01); *H01L 31/1876* (2013.01); *H01L 31/206* (2013.01); *H02S 20/25* (2014.12); *H02S 40/32* (2014.12); *H02S 40/38* (2014.12);
(Continued)

(58) Field of Classification Search
CPC . H01L 31/048; H01L 31/0481; H01L 31/049; H01L 31/044; H01L 31/0443; H01L 31/0465; H01L 31/1876; H02S 40/30; H02S 30/20; H02S 50/00; H02S 20/25
See application file for complete search history.

(56) References Cited

U.S. PATENT DOCUMENTS 4,652,693 A * 3/1987 Bar-On ............... H01L 31/0201
                                                           136/244
8,796,061 B2    8/2014 Bunea
(Continued)

FOREIGN PATENT DOCUMENTS

WO    WO-2015073415 A1 *  5/2015  ....... H01L 31/03926

*Primary Examiner* — Niki Bakhtiari
(74) *Attorney, Agent, or Firm* — Jenkins, Wilson, Taylor & Hunt, P.A.

(57) ABSTRACT

This specification describes automated reel processes for producing solar modules and solar module reels. In some examples, a method includes receiving a continuous feed of photovoltaic devices on a photovoltaic device sheet. The method includes locating and bypassing one or more defective photovoltaic devices on the photovoltaic device sheet. The method includes installing bussing for the photovoltaic devices on the photovoltaic device sheet. The method includes feeding the photovoltaic device sheet to an encapsulation system to output a photovoltaic module sheet.

16 Claims, 11 Drawing Sheets

(51) Int. Cl.
  *H01L 31/0443* (2014.01)
  *H01L 31/20* (2006.01)
  *H02S 50/00* (2014.01)
  *H01L 31/049* (2014.01)
  *H01L 31/18* (2006.01)
  *H02S 40/32* (2014.01)
  *H01L 31/05* (2014.01)
  *H02S 20/25* (2014.01)
  *H02S 40/38* (2014.01)
  *H02S 50/15* (2014.01)

(52) U.S. Cl.
  CPC .............. *H02S 50/00* (2013.01); *H02S 50/15* (2014.12); *Y02E 10/50* (2013.01)

(56) References Cited

U.S. PATENT DOCUMENTS

| | | |
|---|---|---|
| 9,842,951 B2 | 12/2017 | Sethi et al. |
| 9,978,896 B2 | 5/2018 | Sethi et al. |
| 2001/0054262 A1* | 12/2001 | Nath ................... H01L 31/048 52/173.3 |
| 2005/0172995 A1* | 8/2005 | Rohrig ............ H01L 31/02021 136/243 |
| 2009/0242015 A1* | 10/2009 | Wattman ............... H01L 31/048 136/251 |
| 2010/0000603 A1* | 1/2010 | Tsuzuki ............ B32B 17/10018 136/259 |
| 2010/0051100 A1* | 3/2010 | Nocito ................... E04F 10/06 136/256 |
| 2011/0048505 A1 | 3/2011 | Bunea et al. |
| 2013/0000694 A1 | 1/2013 | Bunea et al. |
| 2013/0206221 A1 | 8/2013 | Gannon et al. |
| 2015/0171788 A1 | 6/2015 | Bunea |
| 2015/0249175 A1 | 9/2015 | Bunea |
| 2015/0249426 A1 | 9/2015 | Okawa et al. |
| 2015/0280643 A1 | 10/2015 | Okawa et al. |
| 2015/0349703 A1* | 12/2015 | Morad ................. H01L 31/049 136/251 |
| 2016/0268963 A1* | 9/2016 | Tsai ................... H01L 31/0443 |
| 2017/0077332 A1 | 3/2017 | Sethi et al. |
| 2017/0077343 A1 | 3/2017 | Morad et al. |
| 2017/0162736 A1 | 6/2017 | Sethi et al. |
| 2017/0213929 A1 | 7/2017 | Lance et al. |
| 2017/0330993 A1 | 11/2017 | Sewell et al. |
| 2018/0006598 A1 | 1/2018 | Bunea |
| 2018/0033902 A1 | 2/2018 | Caswell et al. |

* cited by examiner

AUTOMATED REEL PROCESSES FOR PRODUCING SOLAR MODULES AND SOLAR MODULE REELS

CROSS-REFERENCE TO RELATED APPLICATIONS

This application claims the benefit of U.S. Provisional Patent Application Ser. No. 62/491,371 filed Apr. 28, 2017, the disclosure of which is incorporated herein by reference in its entirety.

TECHNICAL FIELD

The subject matter described in this specification relates generally to photovoltaic solar systems and in particular automated reel processes for producing solar modules and solar module reels.

BACKGROUND

Photovoltaic (PV) cells, commonly known as solar cells, are devices for converting solar radiation into electrical energy. PV cells can be assembled into solar modules, which may be used to convert sunlight into electricity. A solar energy system typically includes multiple solar modules, one or more inverters, and interconnection wiring.

DETAILED DESCRIPTION

This specification describes automated reel processes for producing solar modules, solar module sheets and solar module reels. In some examples, a method for producing solar modules includes an automated reel process. For example, instead of producing arrays of shingled solar cells and assembling them in a grid layout for modules, the method can include producing long, and/or flexible solar module sheets with modular electrical connections throughout. The solar modules sheets can be wound around a reel, e.g., for transportation and storage. In an embodiment, as used herein, solar module sheets can also be referred to as solar modules.

Some conventional glass backsheet modules and glass/glass modules are heavy and require a myriad of wiring in the field to convert individual modules into operational devices and systems. In some cases, solar modules are transported from one stage of production to a glass module, creating a requirement for solar modules to be held together strongly enough so that they can be handled without breaking, e.g., by an intermediate cure. The transport can induce cracks and failures, leading to yield loss. More yield loss can be incurred during the layup portion of the module production process. Using the automated reel processes described in this specification can improve solar module production in some aspects over these conventional processes.

In general, using the automated reel processes and solar module reels described in this specification can potentially increase yield, increase throughput, and reduce the structural requirements of intermediate steps (such as curing conductive adhesive between solar cell strips). Furthermore, wiring in the field can be simplified because the individual sections of the reel can more easily be connected in series or parallel.

Figure 1:
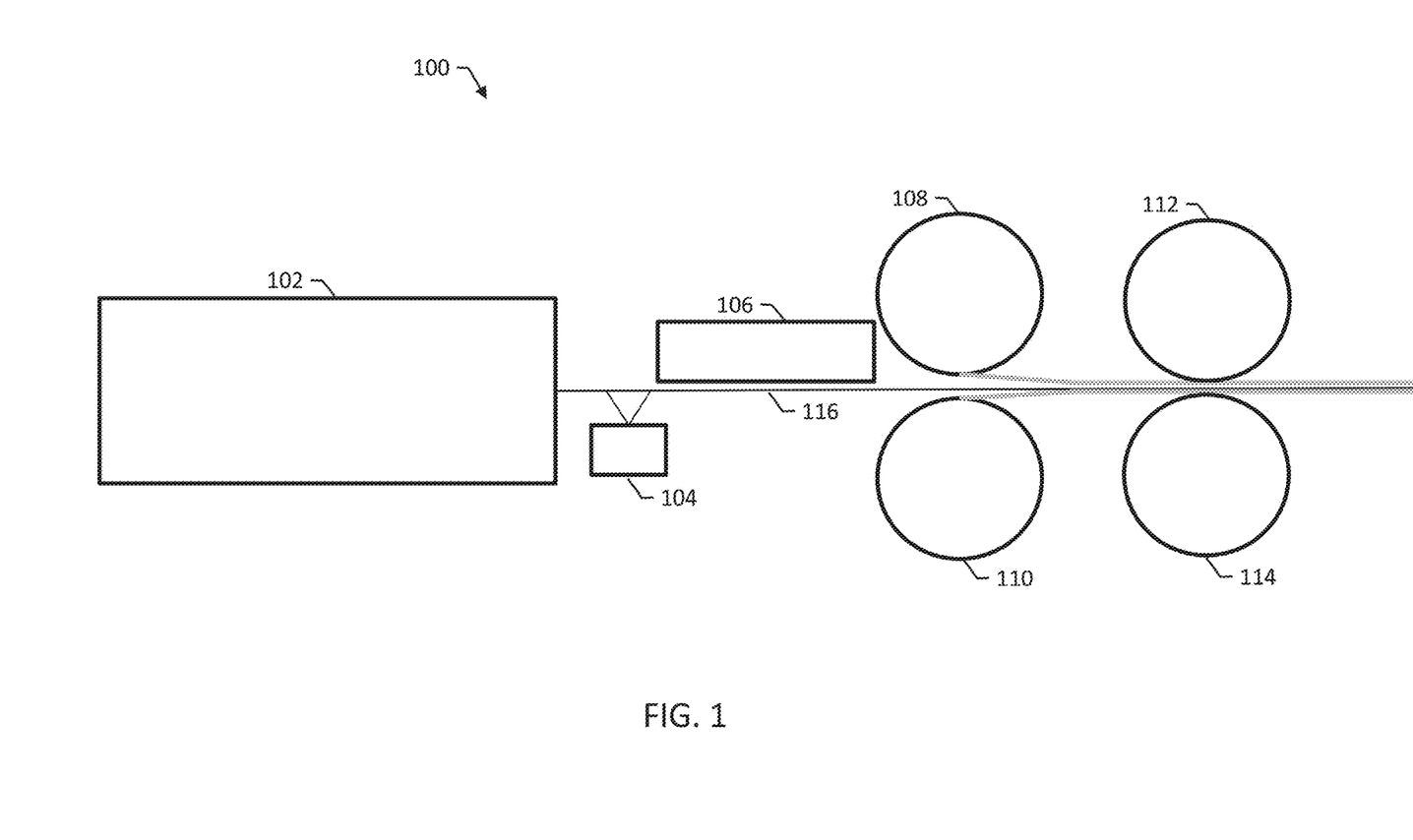
FIG. 1 illustrates a system for producing PV sheets.

FIG. 1 illustrates a system 100 for producing solar modules. In general, the system 100 can produce solar modules using any appropriate type of solar cell, e.g., shingled strips of solar cells, interdigitated back contact (IBC) solar cells, front contact solar cells, or other types of solar cells. In one example, monocrystalline, polycrystalline and/or any other type of silicon-based solar cell can be used. The system 100 uses a continuous process, i.e., a process that is uninterrupted during the production of a single solar module or solar reel. The process is uninterrupted by breaks in the process for, e.g., transportation between workstations. In some embodiments, the process is continuous where automation, e.g., a conveyor 116, can be used to transport a solar module sheet from one process to another process without interruption.

The system 100 can include an apparatus 102 for outputting PV devices ready for encapsulation. For example, the apparatus 102 can be an oven configured to cure shingled strips of solar cells as part of a solar module sheet. The apparatus 102 outputs the PV devices onto, e.g., a conveyor belt or autonomous placement robot. Generally, the system 100 uses a reel of narrow encapsulation (e.g., ethylene tetrafluoroethylene (ETFE)) to create a front sheet and a reel of encapsulation to create a backsheet, sandwiching the PV devices as they exit the apparatus 102. In some examples, the system 100 performs encapsulation and then separately forms a front sheet and a backsheet.

The system 100 can include an inspection device 104 for inspecting the PV devices output by the apparatus 102. The inspection device 104 can use any appropriate technology for characterizing the PV devices and, e.g., identifying defective PV devices or portions of PV devices that are defective (e.g., cracked). In some examples, the inspection device 104 uses luminescence imaging, e.g., photoluminescence (PL) imaging or electroluminescence imaging, for inspection. In one example, the inspection device 104 can be an automatic optical inspection system (AOI). In some examples, the PV devices are visually inspected. Jumpers can be applied to bypass one or more cells before the front and back sheet layers are applied. It may be desirable to bypass one or more cells if the cell is defective upon manufacture, becomes defective in the field and/or has temporary or permanent reduced performance during operation (e.g. when shaded).

The system 100 can include an in-line bussing device 106. The in-line bussing device 106 can perform bussing for the PV devices using a parallel bussing ribbon with, e.g., interlayer dielectric (ILD) or intermetal dielectric (IMD) applications that periodically attach to strips or portions of the PV device. A separate return line 214 can be integrated to allow for module level electronics and communication as appropriate for specific applications.

In some examples, the system 100 performs in-line adding of in-laminate diodes, which can be used as bypass diodes. For example, an in-laminate diode can be configured, by virtue of appropriate electrical connections, for protecting a selected number of solar cells. In some cases, e.g., with front contact cells, an in-laminate diode is configured to protect about 24 front contact cells. In some examples, the system 100 can produce a ruggedized solar module by adding diodes more frequently, i.e., such that each diode protects fewer solar cells.

The system 100 includes a roll 108 of frontsheet material and encapsulation and a roll 110 of backsheet material and encapsulation. In some examples, the system 100 forms a metal backsheet and a front sheet formed of glass, e.g., thin glass; the front sheet and/or the metal backsheet may not be continuous over the length of the resulting solar module. The system 100 also includes top and bottom vacuum/heated nip rollers 112 and 114. The front sheet and the back sheet for the PV devices can be compressed together in a vacuum/heated nip roller and, in some examples, further cured downstream. Adhesion can be aided by a layer of pressure-sensitive adhesive (PSA) on one or both of the front and back layers.

The encapsulation material can be, e.g., polyolefin (PO) or any appropriate material for mechanically attaching the PV devices to the front and back sheets. In some examples, the encapsulation material is fiberglass-reinforced composite. The encapsulation materially generally provides optical matching and a moisture barrier of the PV devices and, in some examples, the encapsulation is liquid dispensed. In some examples, the encapsulation can be a laminated structure including one or more layers of, e.g., thermoset or thermoplastic polymers or both.

In some examples, the system 100 creates a frontsheet and a backsheet that are both flexible. In some examples, one of the frontsheet and the backsheet is rigid or semi-rigid or has sections that are rigid with gaps in between them, and the other of the frontsheet and the backsheet is flexible. One or both of the frontsheet and the backsheet can be transparent. One or both of the frontsheet and the backsheet can be patterned or textured or both. In some examples, the backsheet is patterned with holes sized to add junction boxes and/or other module-level electronics (e.g. dc-dc converters, microinverters, etc.), such that the holes mirror the outlets of the bussing.

Separations in the resulting PV sheet can be created periodically based on length or voltage requirements to create isolated sections within the PV sheet. The PV sheet can be periodically perforated or cut in the field to use mechanically shorter sub-strings in the field which can be connected together electrically. In examples where the system produces arrays of shingled solar cell strips, the system 100 can be configured to provide more than one array of shingled solar cell strips in parallel, e.g., so that the system 100 processes the arrays of shingled solar cell strips on a same PV sheet at the same time.

The resulting PV sheets can be stored, transported, and/or installed in any appropriate manner. For example, a PV sheet can be wound into a reel. In another example, a PV sheet can be cut into shorter segments with appropriate termination and stacked or wound around a reel.

Figure 2:
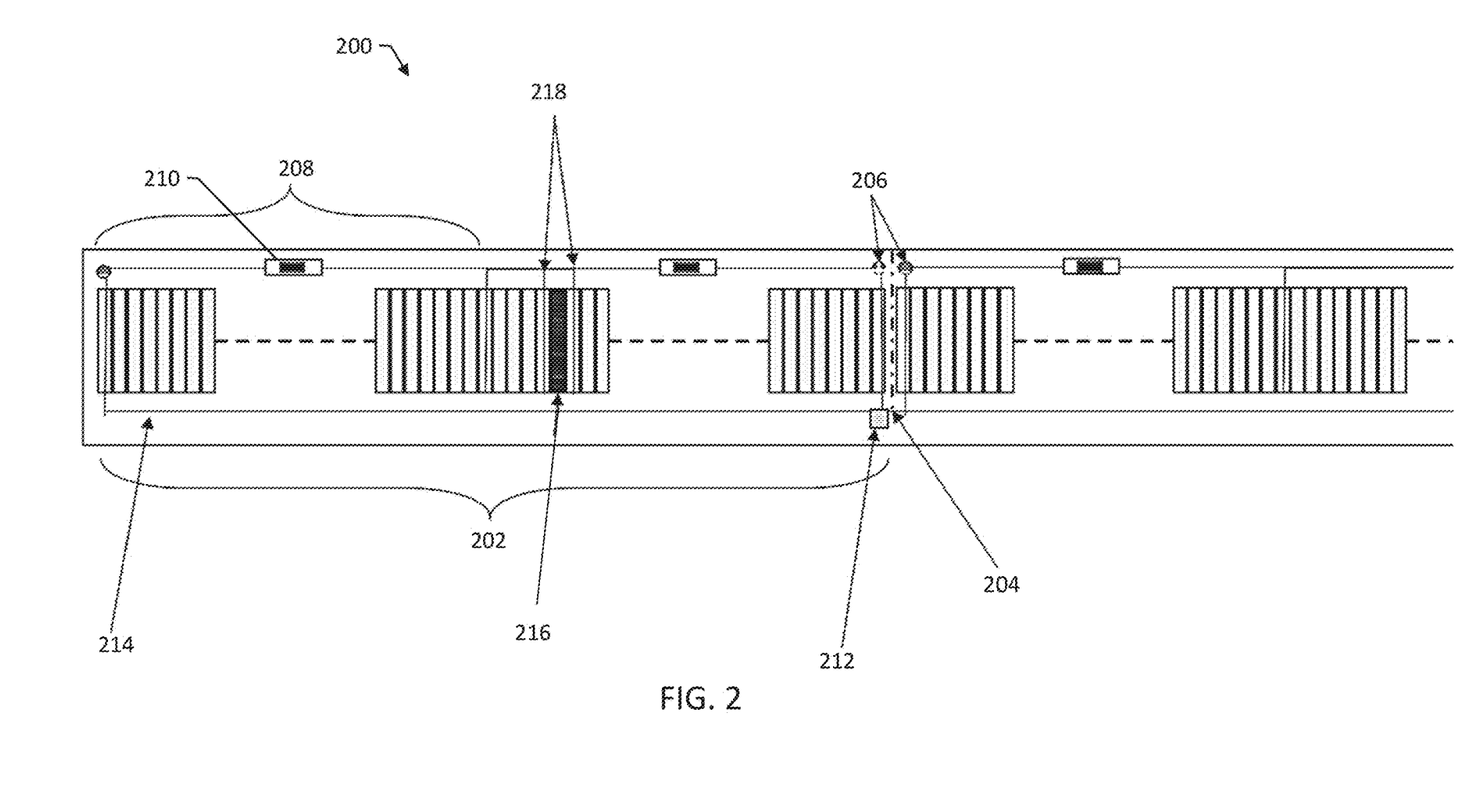
FIG. 2 is an overhead view of an example PV sheet produced by the system of FIG. 1.

FIG. 2 is an overhead view of an example PV sheet 200 produced by the system 100 of FIG. 1. The PV sheet 200 can include shingled strips of solar cells. The shingled strips can be, e.g., cut from standard dimension silicon solar cells and joined together in an overlapping manner using conductive adhesive that connects strips to adjacent strips. Although, as shown, the solar cells can be shingled strips of cells, in any type of solar can be used. In one example, the solar cells can instead be IBC solar cells. The PV sheet 200 can be long relative to its width, e.g., hundreds of meters long.

The PV sheet 200 is configured to provide a customized voltage length 202 by virtue of having a mechanical separation point 204. The customized voltage length 202 can be tailored to particular applications and is based on the sum of the voltages of the solar cells in the length that are connected in series by virtue of the overlapping connections between the shingled strips of solar cells. In one example, the customized voltage length may comprise N>25 solar cell strips, with no single solar cell strip in the group of <N solar cells individually electrically connected in parallel with a bypass diode. Examples of shingled strips of cells are described in U.S. Pat. Pub. 2017/0077343, which is hereby incorporated by reference herein in its entirety. Although, as shown, the solar cells can be shingled strips of cells, in any type of solar can be used. In one example, the solar cells can instead be IBC solar cells. The customized voltage length 200 may provide, e.g., a voltage of 50V, 600V, 1000V, or 1500V.

The PV sheet 200 can include electronic leads for connecting the PV sheet to external circuits, e.g., to junction boxes, inverters or loads. The PV sheet 200 can include diode protected regions 208 by virtue of diodes 210 periodically installed by the system 100 along the length of the PV sheet 200. The PV sheet 200 includes module level electronics 212 that can be configured for particular applications and a communication return 214 for the module level electronics 212.

In some cases, the PV sheet 200 may include defective strips. The PV sheet 200 as illustrated in FIG. 2 includes a cracked strip 216. The system 100 can bypass the cracked strip 216 by installing jumpers 218 around the cracked strip 216 to electrically connect adjacent strips together. In other cases, a defective or poorly performing cell is not apparent upon manufacturing and/or will occur in operation in which case a bypass diode will bypass the corresponding group of cells.

Figure 3A:
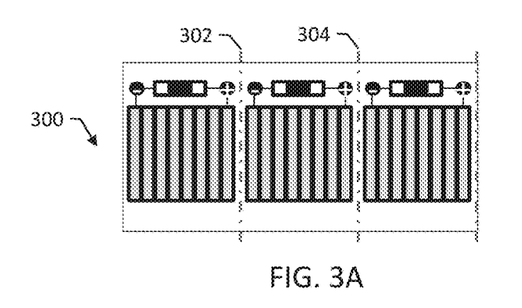
FIGS. 3A-B illustrate how sections of a PV sheet produced by the system of FIG. 1 can be separated to produce different voltages.
Figure 3B:
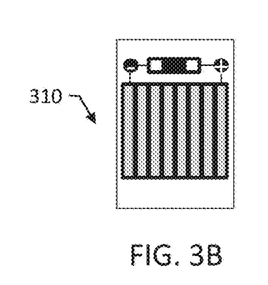
Figure 4A:
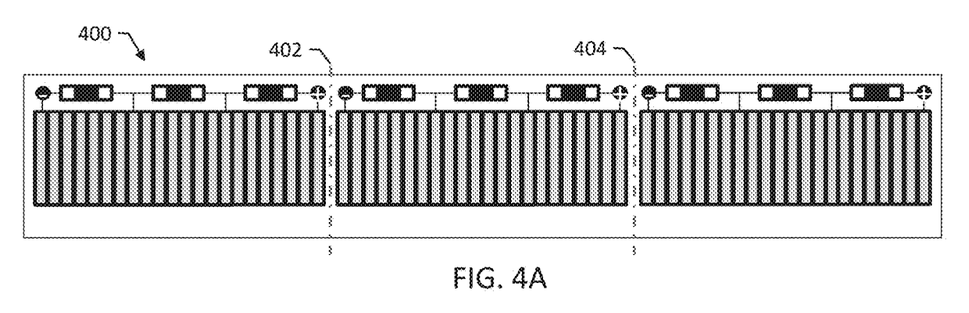
FIGS. 4A-B illustrate how sections of a PV sheet produced by the system of FIG. 1 can be separated to produce different voltages.
Figure 4B:
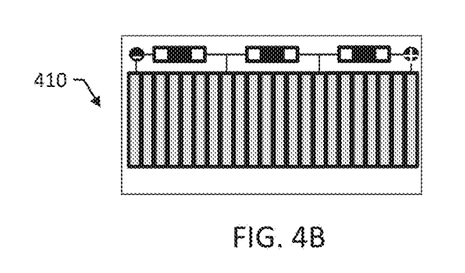

FIGS. 3A-B illustrate how sections of a PV sheet produced by the system of FIG. 1 can be separated to produce different voltages. FIG. 3A shows a top view of a PV sheet 300 prior to separation along two separation lines 302 and 304 in the PV sheet 300. FIG. 3B shows a resulting separated PV sheet 310 after separation. FIGS. 4A-B illustrate how sections of a PV sheet produced by the system of FIG. 1 can be separated to produce different voltages. FIG. 4A shows a top view of a PV sheet 400 prior to separation along two separation lines 402 and 404 in the PV sheet 400. FIG. 4B shows a resulting separated PV sheet 410 after separation. The separated PV sheet of 410 has a longer length than the PV sheet 310 of FIG. 3B and will therefore produce a greater voltage under the same circumstances.

Figure 5A:
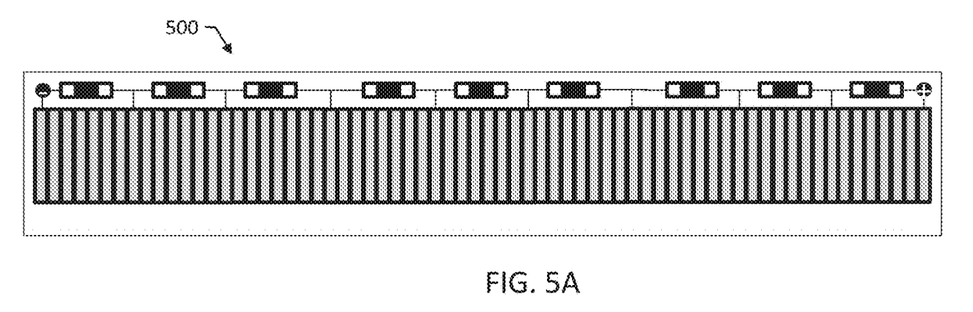
FIGS. 5A-B show an example PV sheet that has not been divided.
Figure 5B:
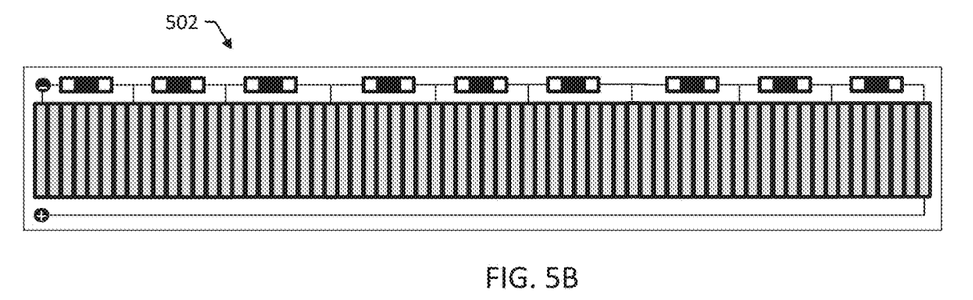

FIGS. 5A-B shows an example PV sheet 500 that has not been divided, so that the PV sheet 500 may be very long. In an example, the PV sheet 500 can have a length in the range of hundreds of meters. The PV sheet 500 can be used in, e.g., high voltage applications. FIG. 5A shows the PV sheet 500 in a first wiring configuration, and FIG. 5B shows the PV sheet 502 in a second wiring configuration.

Figure 6A:
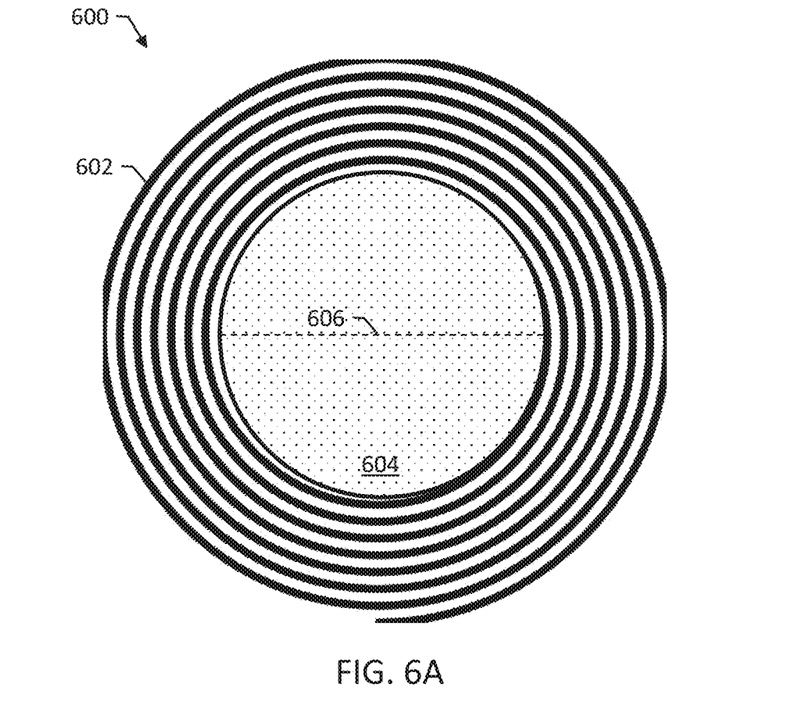
FIGS. 6A-E illustrate example solar module reels.

FIGS. 6A-E illustrate example solar module reels. FIG. 6A shows a side view of a solar module reel 600. The solar module reel 600 includes a PV sheet 602 produced by the system 100 wound around a reel 604. The PV sheet 602 is wound around the reel 604, e.g., for transportation and storage. The PV sheet 602 can be wound around the reel 604, transported, unwound and installed, then wound back on the reel 604 for transportation to a different location. The reel may have a minimum diameter 606 to prevent solar cells or solar cell strips from cracking, e.g., the minimum diameter 606 may be 25 inches for some applications. In some examples, the solar module reel 600 includes power electronics or other electrical devices, e.g., one or more of: a DC optimizer, a battery, a microinverter, and the like.

Figure 6B:
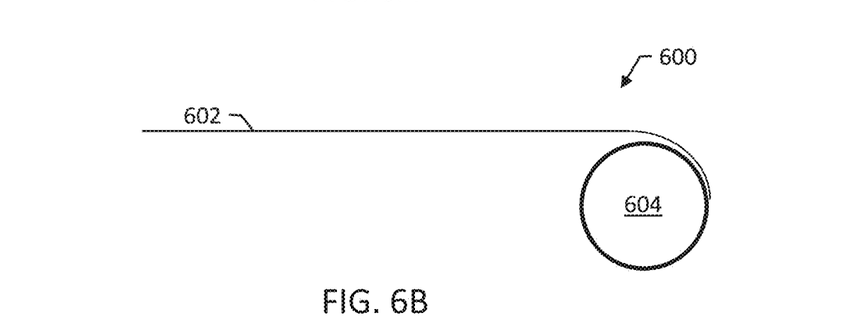
Figure 6C:
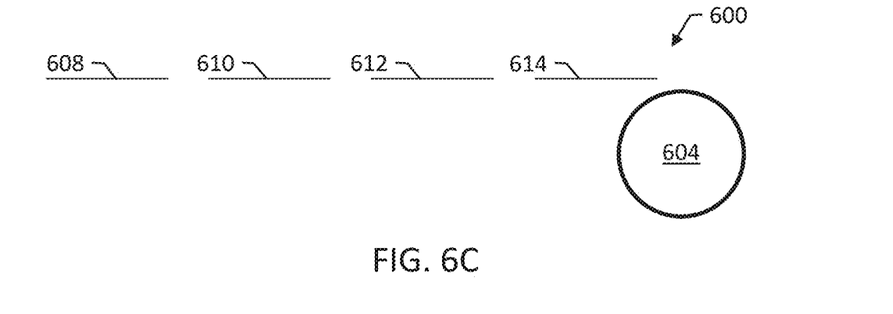

FIG. 6B illustrates the solar module reel 600 after the PV sheet 602 has been almost entirely unwound from around the reel 604. In some examples, the PV sheet 602 is installed whole after unwinding from the reel 604 so that the entire PV sheet 602 operates as a solar module. FIG. 6C illustrates four solar modules 608, 610, 612, and 614 that were created by dividing the PV sheet 602 in three locations after unwinding the PV sheet 602 from the reel 604. For example, the PV sheet 602 can be divided at locations such that the resulting PV modules 608, 610, 612, and 614 have appropriate lengths to generate voltages for a particular application. The resulting PV modules 608, 610, 612, and 614 may each have different lengths as appropriate for the application.

Figure 6D:
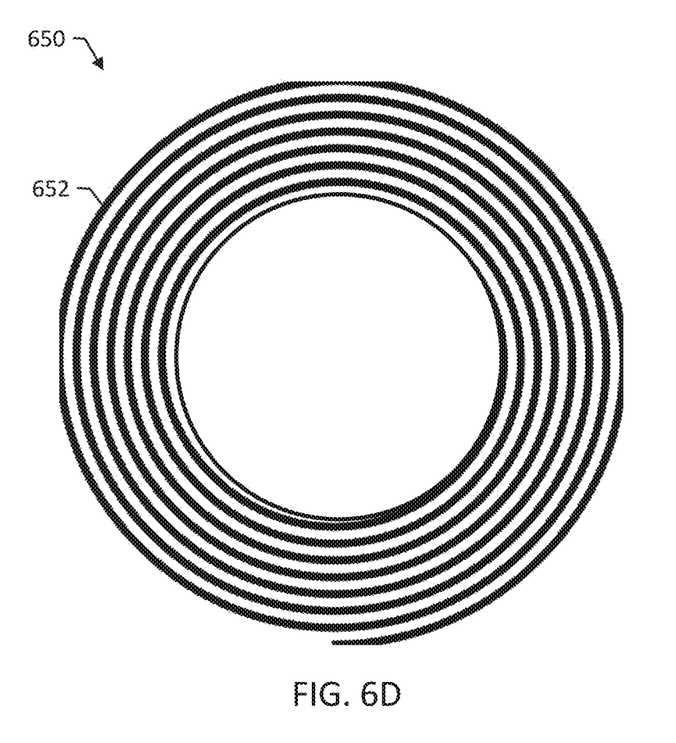
Figure 6E:
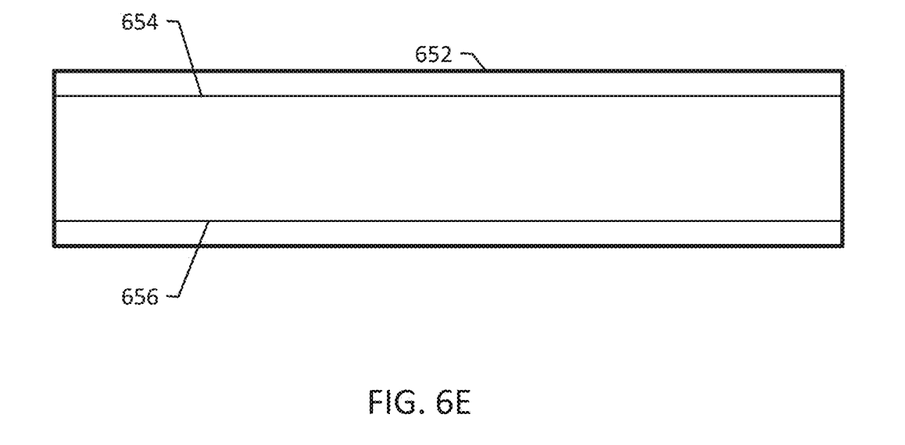

FIG. 6D shows a side view of an example solar module reel 650. The solar module reel 650 includes a PV sheet 652 that has been rolled so that the PV sheet 652 does not bend by more than a maximum bend radius. FIG. 6E shows a top view of the PV sheet 652 in a flat state, e.g., prior to being rolled into the solar module reel 650 of FIG. 6D. The PV sheet 652 includes metal strips 654 and 656 on opposite sides of the PV sheet 652. In general, the metal strips 654 and 656 can be located in any appropriate locations (e.g., following the long edges of the PV sheet 652 at the edges or offset interior from the edges). The metal strips 654 and 656 can be on top of or underneath a laminate structure of the PV sheet 652 or embedded within the laminate structure.

The metal strips 654 and 656 are configured, by virtue of materials selection and the dimensions (e.g., depth and width) of the metal strips 654 and 656, to prevent the PV sheet 652 from bending by more than the minimum bend radius. For example, the metal strips 654 and 656 can configured so that forces applied by a spooling machine or by a typical installer in rolling the PV sheet 652 would not be sufficient to cause the metal strips 654 and 656 to bend by more than the minimum bend radius. This feature can be useful, e.g., so that the reel 604 of FIGS. 6A-C is optional.

In some examples, the metal strips 654 and 656 are created by adding a thin piece of any appropriate metal into the sides of a laminate to stiffen the laminate. The minimum bend radius is determined based on how much the PV sheet 626 (e.g., any PV cells within the PV sheet 626) is able to bend before breaking. The metal material and the dimensions of the metal material are then selected based on the minimum bend radius.

Figure 7A:
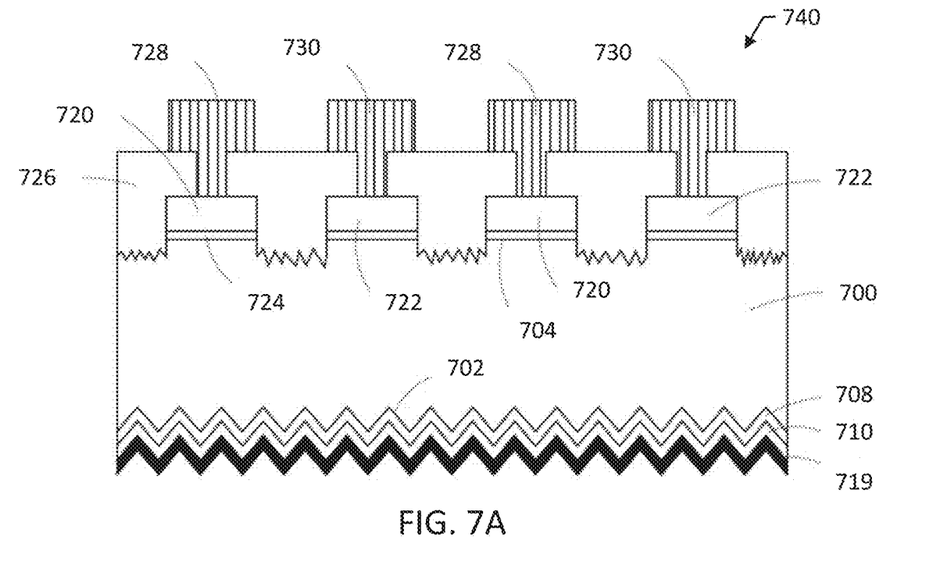
FIGS. 7A-C illustrate example PV devices that can be used in the system of FIG. 1 to produce solar modules.
Figure 7B:
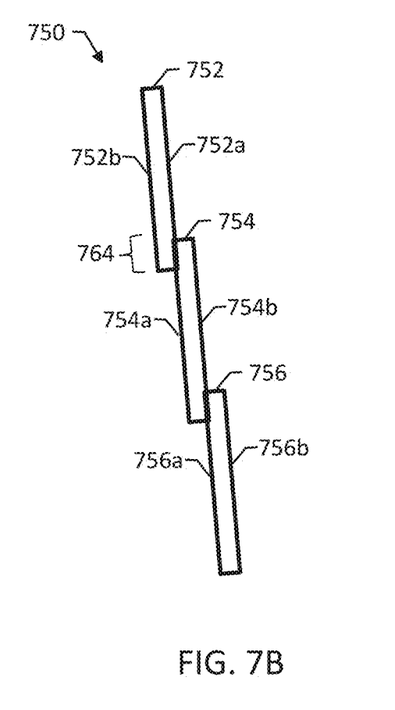
Figure 7C:
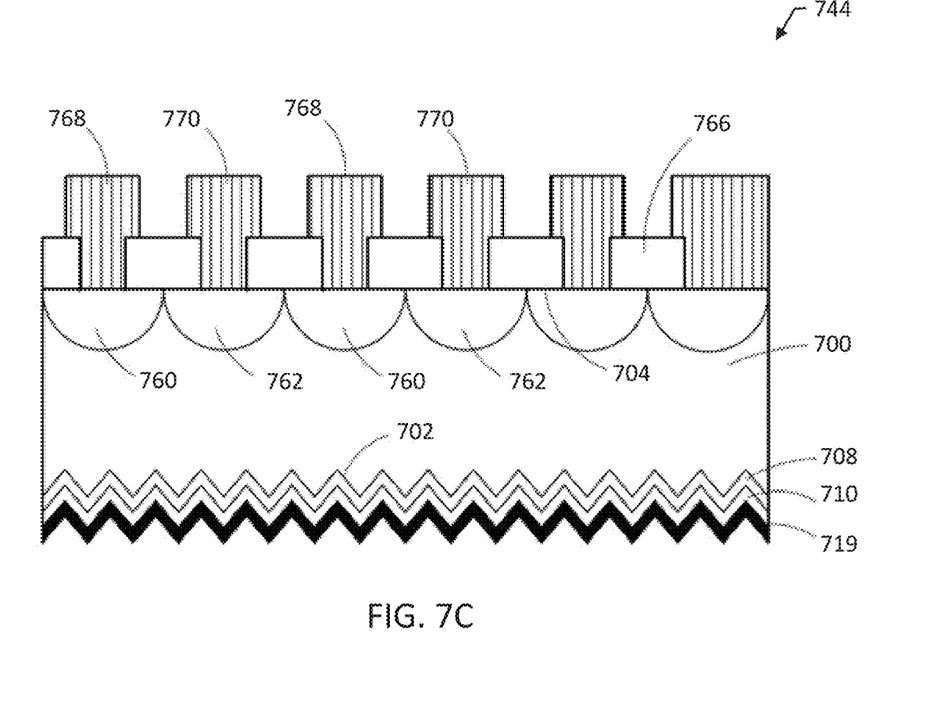

FIGS. 7A-C illustrate example PV devices that can be used in the system 100 of FIG. 1 to produce solar modules. As noted above, the system 100 can use any appropriate type of PV device, and FIGS. 7A-C are provided for purposes of illustration.

FIG. 7A illustrates a cross-sectional view of a back-contact solar cell 740 having emitter regions formed above a back surface of a substrate.

The solar cell 740 includes a silicon substrate 700 having a light-receiving surface 702. A passivating dielectric layer 708 is disposed on the light-receiving surface 702 of the silicon substrate 700. An optional intermediate material layer (or layers) 710 is disposed on the passivating dielectric layer 708. An Anti-Reflective Layer (ARC) layer 719 is disposed on the optional intermediate material layer (or layers) 710, as shown, or is disposed on the passivating dielectric layer 708.

On the back surface of the substrate 700, alternating P-type 720 and N-type 722 emitter regions are formed. In one such embodiment, trenches 721 are disposed between the alternating P-type 720 and N-type 722 emitter regions. More particularly, in an embodiment, first polycrystalline silicon emitter regions 722 are formed on a first portion of a thin dielectric layer 724 and are doped with an N-type impurity. Second polycrystalline silicon emitter regions 720 are formed on a second portion of the thin dielectric layer 724 and are doped with a P-type impurity. In an embodiment the tunnel dielectric 724 is a silicon oxide layer having a thickness of approximately 2 nanometers or less.

Conductive contact structures 728/730 are fabricated by first depositing and patterning an insulating layer 726 to have openings and then forming one or more conductive layers in the openings. In an embodiment, the conductive contact structures 728/730 include metal and are formed by a deposition, lithographic, and etch approach or, alternatively, a printing or plating process or, alternatively, a foil or wire adhesion process.

FIG. 7B an example solar device 750 of solar cells arranged in a shingled manner with the ends of adjacent solar cells overlapping. FIG. 7B shows a side view of the solar device 750 that illustrates the orientation of the solar device 750 towards the sun (or other light source such as mirrors facing the sun). The solar device 750 may be referred to as a "supercell" or a "hypercell" or a "solar cell strip."

The solar device 750 includes solar cells 752, 754, and 756 arranged in a shingled manner with the ends or long edges of adjacent solar cells overlapping and electrically connected to form, e.g., a series-connected string. Each solar cell 102, 104, and 106 can include a semiconductor diode structure and electrical contacts to the semiconductor diode structure. Adjacent solar cells are conductively bonded to each other in the region in which they overlap by an electrically conducting bonding material that electrically connects the front surface metallization structure of one solar cell to the rear surface metallization structure of the adjacent solar cell.

For example, consider the first and second solar cells 752 and 752 in the solar device 750. The second solar cell 754 is adjacent to the first solar cell 752 and overlaps the first solar cell 752 in a region 764 where the first and second solar cells 752 and 754 are electrically connected.

Appropriate electrically conducting bonding materials may include, for example, electrically conducting adhesives and electrically conducting adhesive films and adhesive tapes, and conventional solders. In some examples, the electrically conducting bonding material provides mechanical compliance in the bond between the adjacent solar cells that accommodates stress arising from mismatch between the coefficient of thermal expansion (CTE) of the electrically conducting bonding material and that of the solar cells (e.g., the CTE of silicon).

FIG. 7C illustrates a cross-sectional view of a back-contact solar cell 744 having emitter regions formed in a back surface of a substrate and having a UV-cured and thermally annealed ARC layer at a light-receiving surface of the substrate, in accordance with an embodiment of the present disclosure.

The solar cell 744 includes a silicon substrate 700 having a light-receiving surface 702. A passivating dielectric layer 708 is disposed on the light-receiving surface of the silicon substrate 700. An optional intermediate material layer (or layers) 710 is disposed on the passivating dielectric layer 708. An ARC layer 719 is disposed on the optional intermediate material layer (or layers) 710, as shown, or is disposed on the passivating dielectric layer 708. In one embodiment, the ARC layer 719 is a UV-radiation-cured and thermally annealed ARC layer.

Within the back surface of the substrate 700, alternating P-type 760 and N-type 762 emitter regions are formed. More particularly, in an embodiment, first emitter regions 762 are formed within a first portion of substrate 700 and are doped with an N-type impurity. Second emitter regions 760 are formed within a second portion of substrate 700 and are doped with a P-type impurity. Conductive contact structures 768/770 are fabricated by first depositing and patterning an insulating layer to have openings and then forming one or more conductive layers in the openings. In an embodiment, the conductive contact structures 768/770 include metal and are formed by a deposition, lithographic, and etch approach or, alternatively, a printing or plating process or, alternatively, a foil or wire adhesion process.

Figure 8:
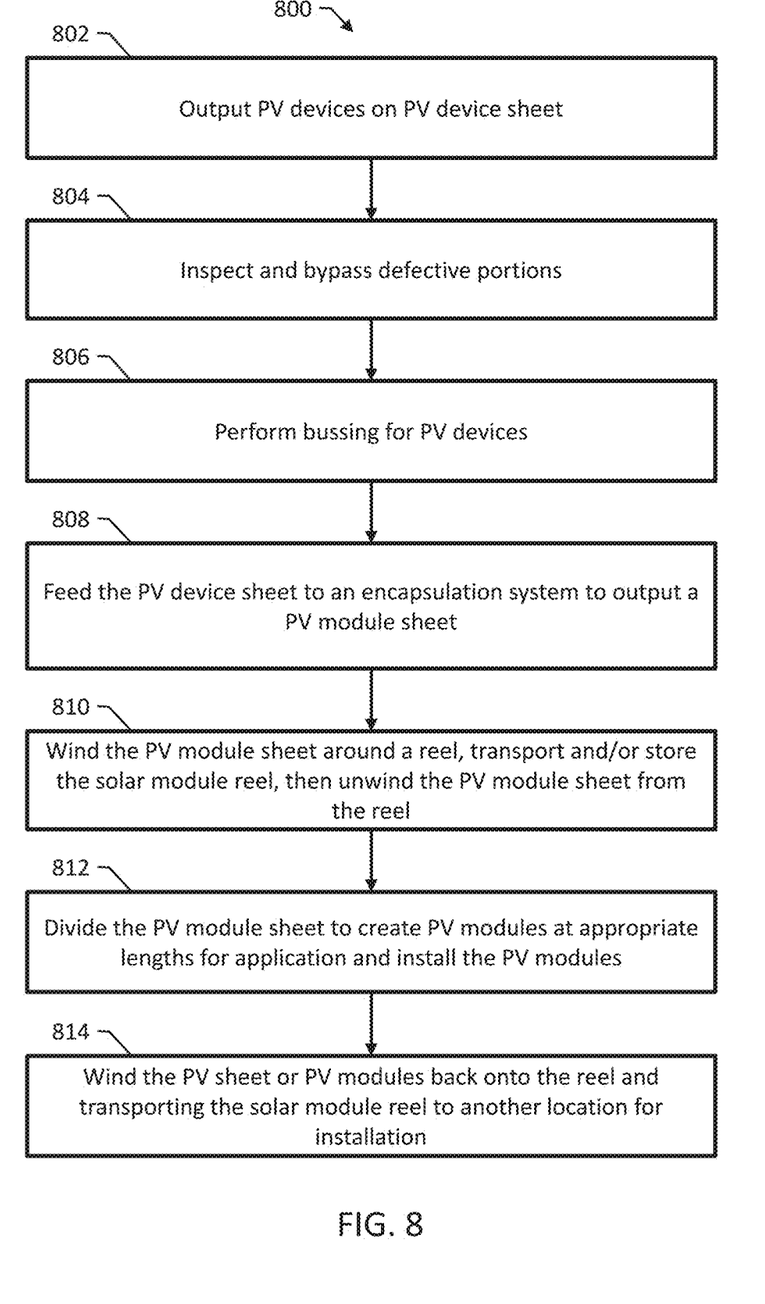
FIG. 8 is a flow diagram of an example method for producing solar modules and solar module reels.

FIG. 8 is a flow diagram of an example method 800 for producing solar modules and solar module reels. The method 800 includes an automated reel process. For example, instead of producing arrays of shingled solar cells and assembling them in a grid layout for modules, the method can include producing long, skinny, and flexible modules with modular electrical connections throughout. The solar modules can be wound around a reel, e.g., for transportation and storage.

The method 800 includes outputting PV devices (e.g., shingled solar cell strips) along a PV device sheet (802). The method 800 includes inspecting the PV device sheet (e.g., using PL imaging) and bypassing any defective portions of the PV device sheet based on the inspection, e.g., by placing jumpers to bypass cracked cells (804). The method 800 includes performing bussing for the PV devices, e.g., using a parallel bussing ribbon (806). Bussing can include adding return ribbons.

The method 800 includes continuously feeding the PV device sheet to an encapsulation system, e.g., top and bottom encapsulation reels and nip/vacuum rollers (808). In some examples, instead of nip/vacuum rollers, the method 800 uses stage laminators that are continuous and uses gates to section off certain areas under lamination. In some other examples, the method 800 uses conventional laminators and includes taking up the slack in between lamination cycles, e.g., with serpentine take-up rollers. The encapsulation system sandwiches the PV device sheet between front and back layers and outputs a PV module sheet.

In some examples, the following steps are optional and may or may not be performed, depending on the application. In one example, the method 800 includes winding the PV module sheet around a reel to create a solar module reel, transporting and/or storing the solar module reel, and then unwinding the PV module sheet for installation (810). The method 800 can include dividing the PV module sheet to create PV modules at appropriate lengths for an application (to create custom voltage ranges) and installing the resulting PV modules (812). The method 800 can include winding the PV sheet back onto the reel and transporting the PV module sheet to another location for installation (814).

Figure 9A:
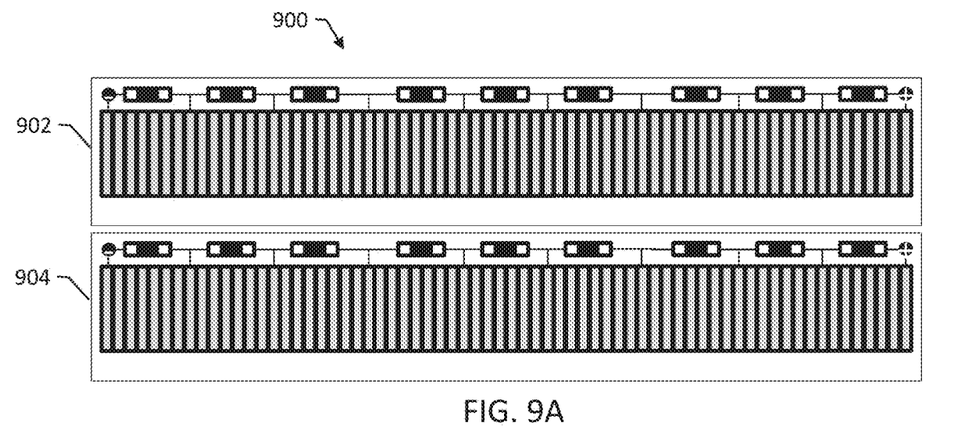
FIGS. 9A-B illustrate parallel arrays of shingled solar cell strips.
Figure 9B:
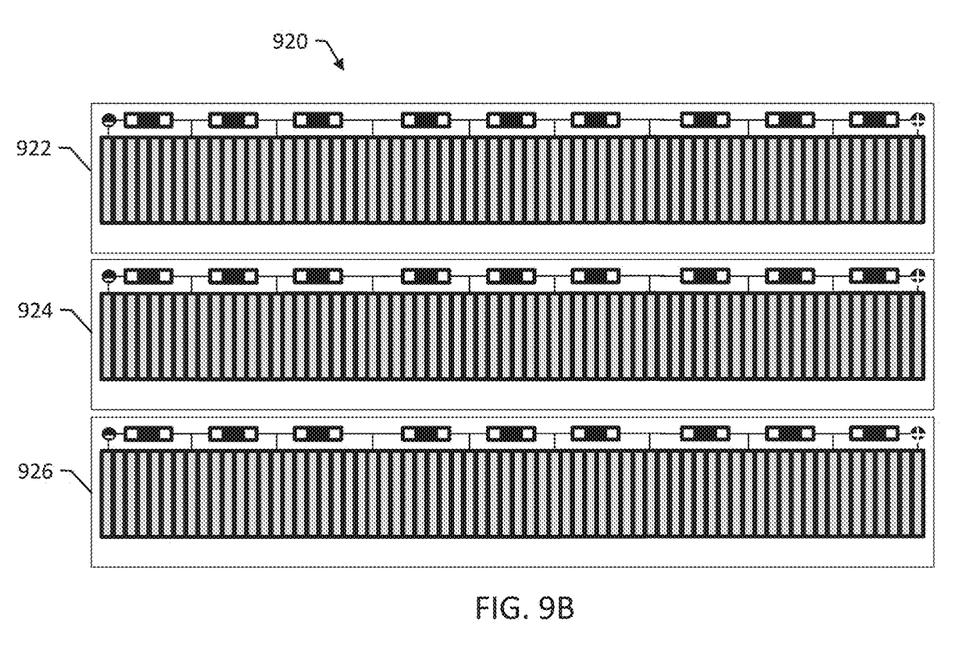

FIGS. 9A-B illustrate parallel arrays of shingled solar cell strips. The system 100 of FIG. 1 can, in some examples, produce the arrays of shingled solar cell strips, side by side, at the same time, e.g., to increase an output rate or to produce wider PV sheets. FIG. 9A shows a first PV device 900 having two parallel arrays of shingled solar cell strips 902 and 904. FIG. 9B shows a second PV device 920 having three parallel arrays of shingled solar cell strips 922, 924, and 926. In general, the system 100 can produce any appropriate number of parallel arrays of shingled solar cell strips.

Figure 10:
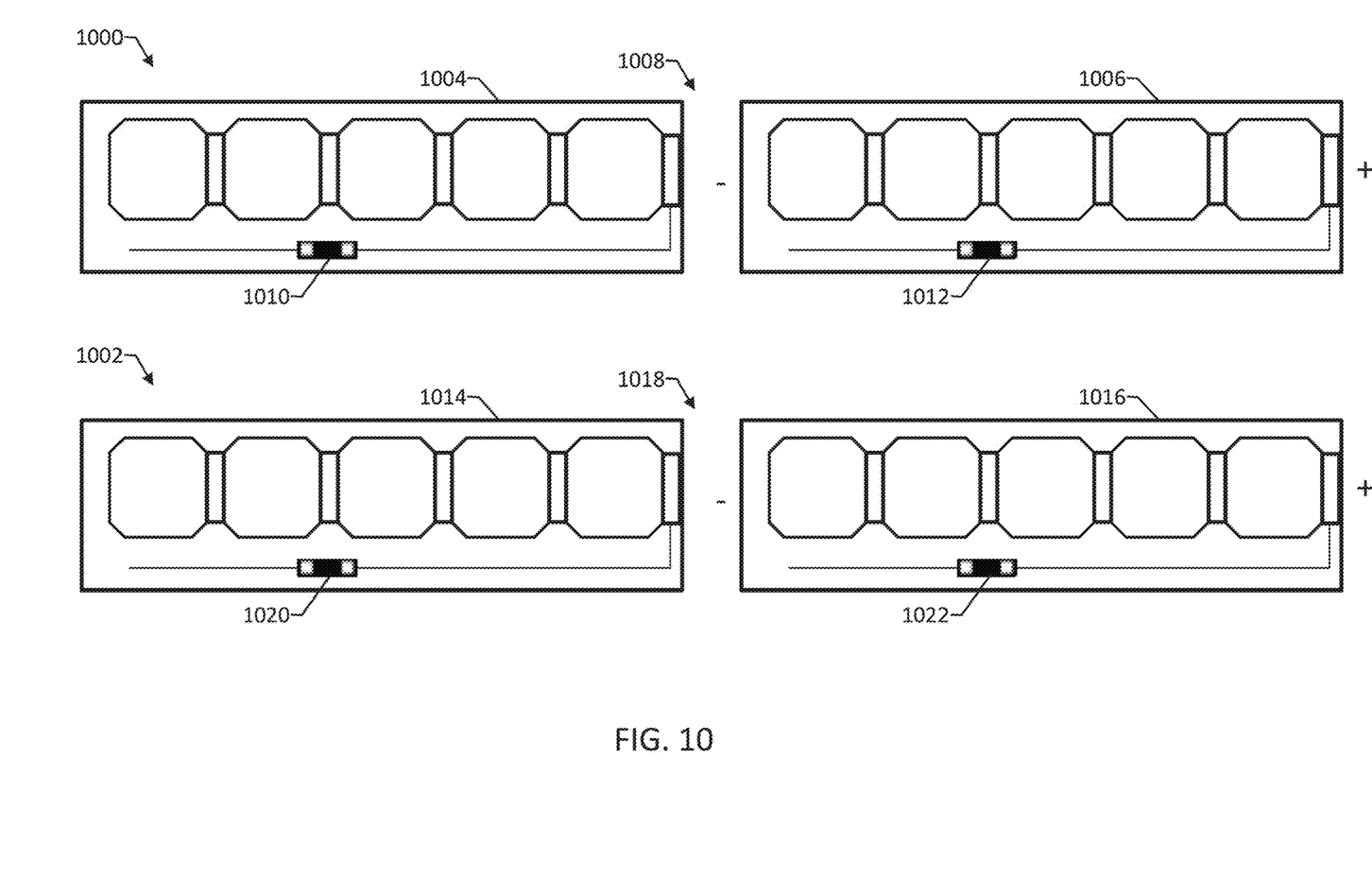
FIG. 10 is an overhead view of example PV sheets formed using interdigitated back contact (IBC) solar cells.

FIG. 10 is an overhead view of example parallel PV sheets 1002 and 1004 formed using IBC solar cells. The first PV sheet 1002 is configured to provide a customized voltage length by virtue of being divided into separate sections 1004 and 1006 at a mechanical separation point 1008. The first PV sheet 1002 includes electrical connections and electronics, e.g., diodes 1010 and 1012, to provide appropriate electrical coupling between the IBC solar cells.

Similarly, the second PV sheet 1004 is configured to provide a customized voltage length by virtue of being divided into separate sections 1014 and 1016 at a mechanical separation point 1018. The second PV sheet 1004 includes electrical connections and electronics, e.g., diodes 1020 and 1022, to provide appropriate electrical coupling between the IBC solar cells. In general, the PV sheets 1002 and 1004 can be divided and electrically configured to produce different voltages as described above with reference to FIGS. 3A-B, FIGS. 4A-B, and FIGS. 5A-B.

Although specific examples and features have been described above, these examples and features are not intended to limit the scope of the present disclosure, even where only a single example is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed in this specification (either explicitly or implicitly), or any generalization of features disclosed, whether or not such features or generalizations mitigate any or all of the problems described in this specification. Accordingly, new claims may be formulated during prosecution of this application (or an application claiming priority to this application) to any such combination of features. In particular, with reference to the appended claims, features from dependent claims may be combined with those of the independent claims and features from respective independent claims may be combined in any appropriate manner and not merely in the specific combinations enumerated in the appended claims.

The invention claimed is:

1. A solar module reel comprising: a photovoltaic module sheet comprising:

a layer of a plurality of photovoltaic devices, each of the plurality of photovoltaic devices comprising crystalline silicon solar cells;

a plurality of jumpers around a first photovoltaic device comprising a cracked crystalline silicon solar cell, wherein the jumpers electrically connect a first adjacent photovoltaic device on a first side of the cracked crystalline silicon solar cell to a second adjacent photovoltaic device on a second side of the cracked crystalline silicon solar cell such that the jumpers electrically bypass the cracked crystalline silicon solar cell from an electrically connected string of solar cells, and wherein the first adjacent photovoltaic device is adjacent to the first side of the cracked crystalline silicon solar cell and the second adjacent photovoltaic device is adjacent to the second side of the cracked crystalline silicon solar cell;
a bypass diode electrically connected in parallel with the electrically connected string of solar cells including the cracked crystalline silicon solar cell;
bussing for the photovoltaic devices;
top and bottom layers of encapsulation;
and a reel;
wherein the photovoltaic module sheet is wound around the reel.

2. The solar module reel of claim 1, wherein the photovoltaic module sheet comprises a metal backsheet and a front sheet formed of glass.

3. The solar module reel of claim 1, wherein the bussing comprises a plurality of in-laminate diodes.

4. The solar module reel of claim 1, wherein at least one of the top and bottom layers of encapsulation is formed of fiberglass-reinforced composite.

5. The solar module reel of claim 1, wherein at least one of the top and bottom layers of encapsulation is formed of one or more layers of thermoset or thermoplastic polymers or both.

6. The solar module reel of claim 1, comprising one or more of: a DC optimizer, a battery, and an inverter, integrated with the reel.

7. The solar module reel of claim 1, comprising a plurality of strips extending along the photovoltaic module sheet, wherein the strips are configured to prevent the photovoltaic module sheet from bending by more than a minimum bend radius.

8. The solar module reel of claim 1, wherein the photovoltaic module sheet comprises a backsheet patterned with holes that mirror outlets of the bussing.

9. The solar module reel of claim 1, wherein the photovoltaic devices comprise a strip of shingled solar cells, a plurality of interdigitated back contact (IBC) solar cells, or a plurality of front contact solar cells.

10. The solar module reel of claim 1, comprising an additional photovoltaic module sheet wound around the reel and arranged approximately side by side with the photovoltaic module sheet.

11. A solar module reel comprising:
a photovoltaic module sheet comprising a layer of a plurality of crackable crystalline silicon solar cell strips arranged in a shingled manner such that adjacent edges of adjacent ones of the crackable crystalline silicon solar cell strips overlap and top and bottom layers of encapsulation;
a plurality of jumpers around a first photovoltaic device of a first crackable crystalline silicon solar cell strip, the first photovoltaic device comprising a cracked crystalline silicon solar cell, wherein the jumpers electrically connect a first adjacent photovoltaic device on a first side of the cracked crystalline silicon solar cell to a second adjacent photovoltaic device on a second side of the cracked crystalline silicon solar cell such that the jumpers electrically bypass the cracked crystalline silicon solar cell from an electrically connected string of solar cells, and wherein the first adjacent photovoltaic device is adjacent to the first side of the cracked crystalline silicon solar cell and the second adjacent photovoltaic device is adjacent to the second side of the cracked crystalline silicon solar cell;
a bypass diode electrically connected in parallel with the electrically connected string of solar cells including the cracked crystalline silicon solar cell; and
a reel;
wherein the photovoltaic module sheet is wound around the reel.

12. The solar module reel of claim 11 wherein the photovoltaic module sheet comprises one or more bussing ribbon.

13. The solar module reel of claim 12 wherein the bussing comprises a plurality of in-laminate diodes.

14. The solar module reel of claim 12 wherein the one or more bussing ribbon includes a return line connecting module level electronics.

15. The solar module reel of claim 11 wherein the photovoltaic module sheet comprises a mechanical separation point to provide a customized voltage length.

16. The solar module reel of claim 15 wherein the customized voltage length comprises N >25 solar cell strips, with no single solar cell strip in the group of <N solar cells individually electrically connected in parallel with a bypass diode.

* * * * *